United States Patent
Huang et al.

(12) 
(10) Patent No.: US 6,364,668 B1
(45) Date of Patent: Apr. 2, 2002

(54) ELECTRICAL CONNECTION SYSTEM AND METHOD FOR FLAT CIRCUITS

(75) Inventors: San-Shan Huang, Taipei (TW); Gavin Warner, Montrouge (FR)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/767,185

(22) Filed: Jan. 22, 2001

(51) Int. Cl.⁷ .................................................. H01R 9/09
(52) U.S. Cl. ........................................ 439/67; 439/422
(58) Field of Search ............................ 439/67, 77, 492, 439/495, 496, 422, 421; 174/36, 84, 88 C

(56) References Cited

U.S. PATENT DOCUMENTS

| | | | |
|---|---|---|---|
| 3,395,381 A | 7/1968 | Huffnagle | 339/97 |
| 3,675,180 A | 7/1972 | Podmore | 339/17 |
| 3,697,925 A | 10/1972 | Henschen | 339/17 |
| 3,703,604 A | 11/1972 | Henschen et al. | 174/75 |
| 3,960,430 A | 6/1976 | Bunnell et al. | 339/97 |
| 3,999,826 A | * 12/1976 | Yurtin | 339/17 |
| 4,002,393 A | 1/1977 | Merry et al. | 339/97 |
| 4,066,319 A | 1/1978 | Baker et al . | 339/97 |
| 4,082,402 A | 4/1978 | Kinkaid et al. | 339/97 |
| 4,124,266 A | 11/1978 | Wagstaff | 339/97 |
| 4,371,225 A | 2/1983 | Narozny | 339/97 |
| 4,854,883 A | * 8/1989 | Tuckwood | 439/84 |
| 5,195,908 A | 3/1993 | Yamamoto et al. | 439/422 |
| 5,634,813 A | 6/1997 | Patel et al. | 439/422 |

* cited by examiner

Primary Examiner—P. Austin Bradley
Assistant Examiner—Alexander Gilman
(74) Attorney, Agent, or Firm—Stephen Z. Weiss

(57) ABSTRACT

A system provides an electrical connection with a flat circuit and includes a generally rigid dielectric support structure. The flat circuit is located on one side of the support structure. A terminal includes a contact portion at an opposite side of the support structure for electrically engaging a complementary connecting device. A shank portion of the terminal extends from the contact portion through the support structure. A terminating portion at an end of the shank portion is terminated to an appropriate conductor of the flat circuit at the one side of the support structure.

14 Claims, 4 Drawing Sheets

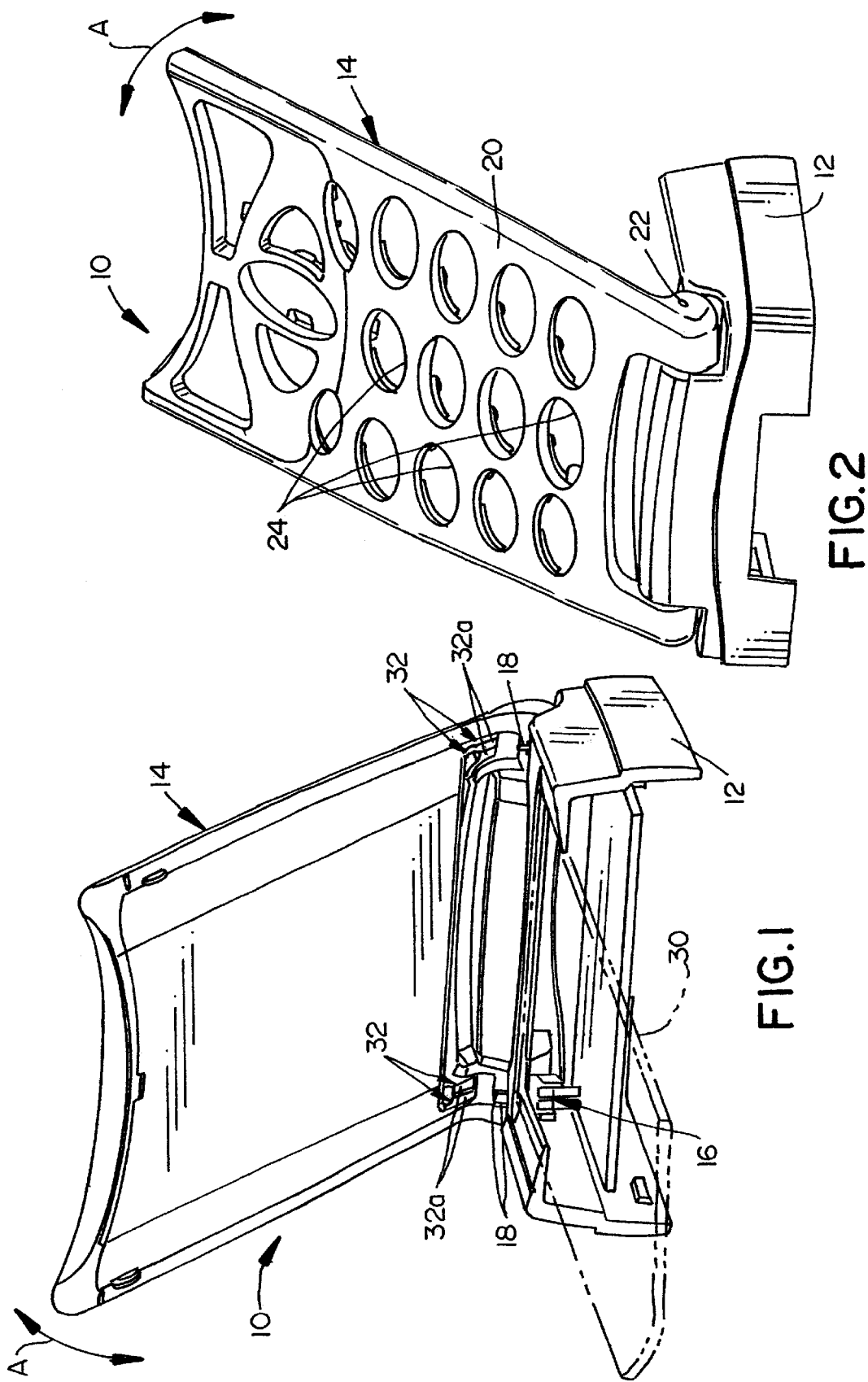

ELECTRICAL CONNECTION SYSTEM AND METHOD FOR FLAT CIRCUITS

FIELD OF THE INVENTION

This invention generally relates to a system and method for providing an electrical connection with a flat circuit, such as in a cover assembly for a mobile telephone.

BACKGROUND OF THE INVENTION

There are a wide variety of systems and methods for terminating the conductors of flat circuits, such as flat flexible circuits, flexible printed circuit boards and the like. A flat flexible circuit conventionally includes an elongated flat flexible dielectric substrate having a pattern of conductors on one or both sides thereof. The conductors may be covered with a thin, flexible protective layer or film on one or both sides of the circuit. If protective layers or films are used, cutouts are formed to expose the underlying conductors where the conductors are to engage the conductors or terminals of a complementary connecting device which may be a second flat circuit, a printed circuit board, discrete electrical wires or the terminals of a complementary connector.

In many applications, flat flexible circuits are supported on some form of generally rigid dielectric support structure. This enables the flexible circuit to be mounted or supported in a given apparatus, and the conductors are easier to be terminated or electrically connected to the conductors or terminals of the complementary connecting device. In one application involving the cover of a mobile telephone, it has become necessary to mount a flat flexible circuit on one side of the cover while engaging and/or disengaging the conductors with a connecting device, such as a switch, on an opposite side of the cover. For instance, a switch located at the inside or bottom of the cover may be actuated in response to the cover moving between open and closed positions. However, the flat flexible cable is located on the opposite or top side of the cover. This creates problems and there is a need for a system and method of electrically engaging or operatively extending the conductors of the flat circuit on the top of the cover with switch contacts located at the bottom of the cover. The present invention is directed to solving these problems and satisfying that need.

SUMMARY OF THE INVENTION

An object, therefore, of the invention is to provide a new and improved electrical connection system for a flat circuit.

Another object of the invention is to provide a new and improved method for providing an electrical connection with a flat circuit.

A further object of the invention is to provide a new and improved cover assembly for a mobile telephone.

In the exemplary embodiment of the invention, the system and method generally includes a rigid dielectric support structure, with a flat circuit on one side of the support structure. A terminal clip includes a contact portion at an opposite side of the support structure for electrically engaging a complementary connecting device. The terminal clip includes a shank portion extending from the contact portion through the support structure. A terminating portion is provided at an end of the shank portion at the one side of the support structure for termination to an appropriate conductor of the flat circuit.

As disclosed herein, the system and method is disclosed in a cover assembly for a mobile telephone. The rigid dielectric support structure is a cover of the assembly, the cover having first and second sides with at least one aperture passing therethrough between the sides. The flat circuit is mounted on the first side of the cover. The contact portion of the terminal clip is located at the second side of the cover for engaging the complementary connecting device. The shank portion of the terminal clip extends from the contact portion through the aperture in the cover and is terminated to the conductor of the flat circuit.

The contact portion of the terminal clip herein comprises a contact plate juxtaposed against the second side of the cover. The terminating portion of the terminal clip comprises a distal end of the shank portion bent into engagement with the conductor. The cover includes a pair of apertures, and the terminal is generally U-shaped with a pair of the shank portions extending from opposite ends of the contact portion through the pair of apertures. The flat circuit herein comprises a flat flexible circuit.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 1 is a perspective view of a cover assembly for a mobile telephone, incorporating the concepts of the invention and looking toward the underside of the cover and with the cover raised;

FIG. 2 is a perspective view of the cover assembly of FIG. 1, looking toward the top side of the cover;

DETAILED DESCRIPTION OF THE PREFERRED EMBODIMENT

Figure 4:
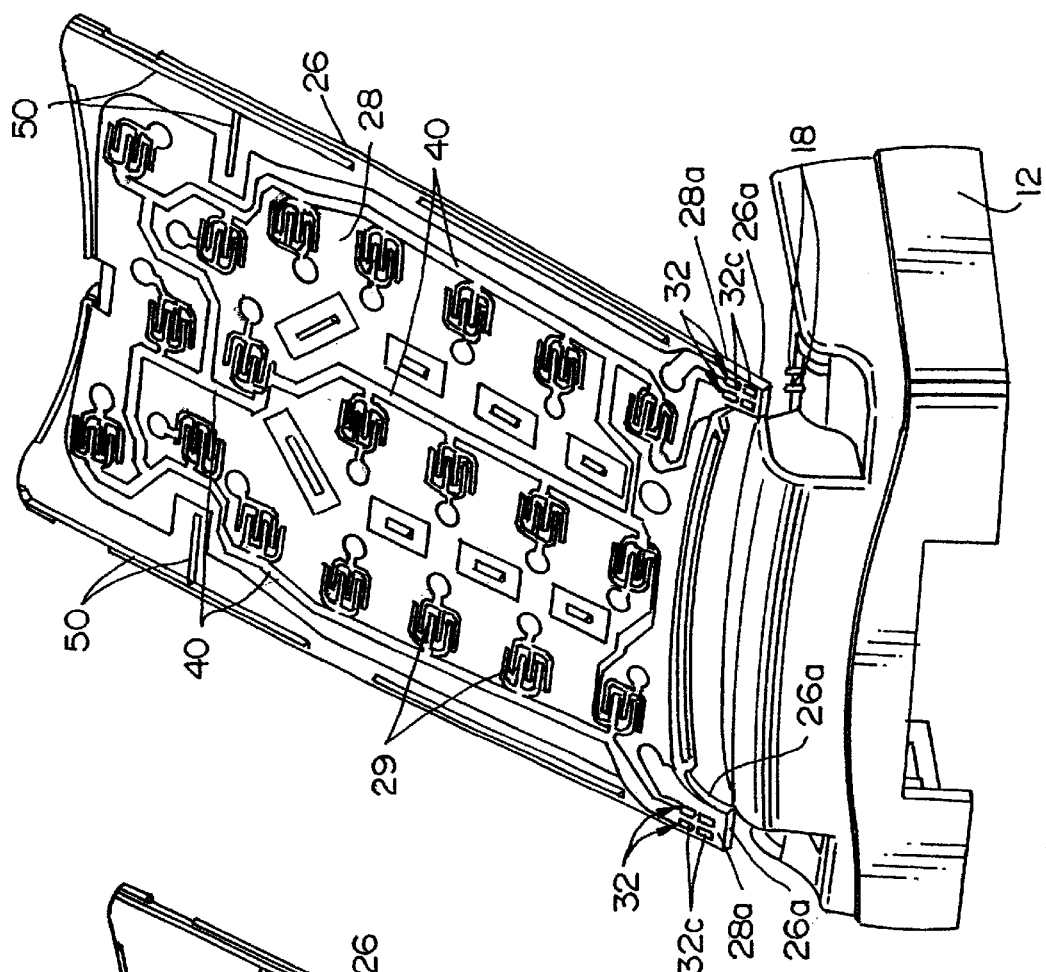
FIG. 4 is a view similar to that of FIG. 3, but with the flat circuit mounted on top of the support plate.

Referring to the drawings in greater detail, and first to FIG. 1, the invention is embodied in a cover assembly, generally designated 10, for a mobile telephone. The cover assembly includes a base 12 appropriately mounted on the mobile telephone and a cover, generally designated 14, pivotally mounted on the base for movement in the direction of double-headed arrow "A" between a closed position and an open position (as shown). Base 12 mounts a pair of laterally spaced switches, generally designated 16, on the inside thereof. Only the left-hand switch is visible in FIG. 1. Nevertheless, each switch includes one or more upwardly extending, vertically reciprocating switch pins 18. In the industry, such switches commonly are called "pogo pin connectors".

Figure 3:
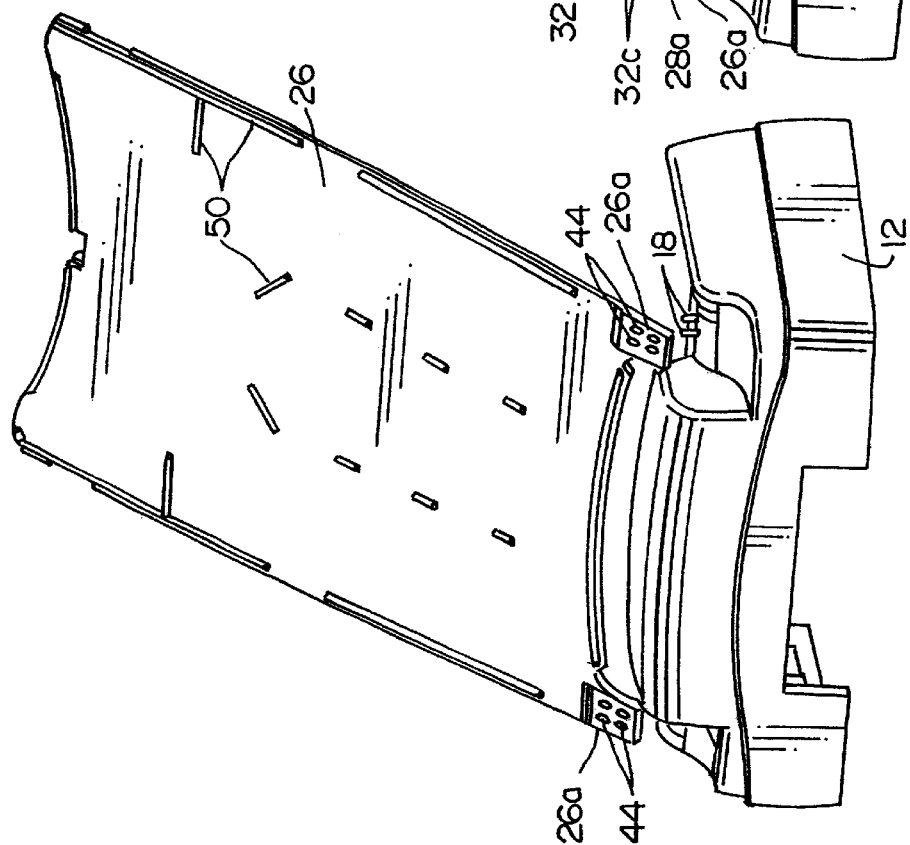
FIG. 3 is a view similar to that of FIG. 2, with the top plate and flat circuit of the cover removed to show the support plate for the flat circuit.

Referring to FIGS. 2–4 in conjunction with FIG. 1, cover 14 includes a generally rigid top plate 20 which is hinged at 22 to base 12 for pivotal movement in the direction of double-headed arrow "A". The top plate has a plurality of apertures 24 which receive a plurality of dome-shaped push-buttons of a conventional keypad (not shown) mounted on the top of the cover. A generally rigid bottom support plate 26 (FIG. 3) is snap-fit into the underside of top plate 20. A flat flexible circuit 28 (FIG. 4) is sandwiched between top plate 20 (FIG. 2) and bottom support plate 26 (FIG. 3). The circuit has conductor pad arrays 29 for engagement by the push buttons of the keypad. It should be understood that, in actual practice, bottom support plate 26 in FIG. 3, along with flat circuit 28 in FIG. 4, will not be unsupportedly suspended as shown in FIGS. 3 and 4, i.e., without top plate 20 (FIG. 2), These depictions are shown simply to provide a better understanding of the laminated or multi-layered assembly of cover 14. FIG. 1 shows that a liquid crystal display (LCD) 30 is disposed on the upper portion of base 12.

FIGS. 5A–5E show the system and method for providing an electrical connection with or terminating flat circuit 28 on top of bottom support plate 26 so that the conductors thereof can be operative for engaging switch pins 18 at the bottom of the support plate beneath cover 14. The system includes the use of a plurality of terminal clips or terminals, generally designated 32, which are visible in FIGS. 1 and 4.

Figure 5A:
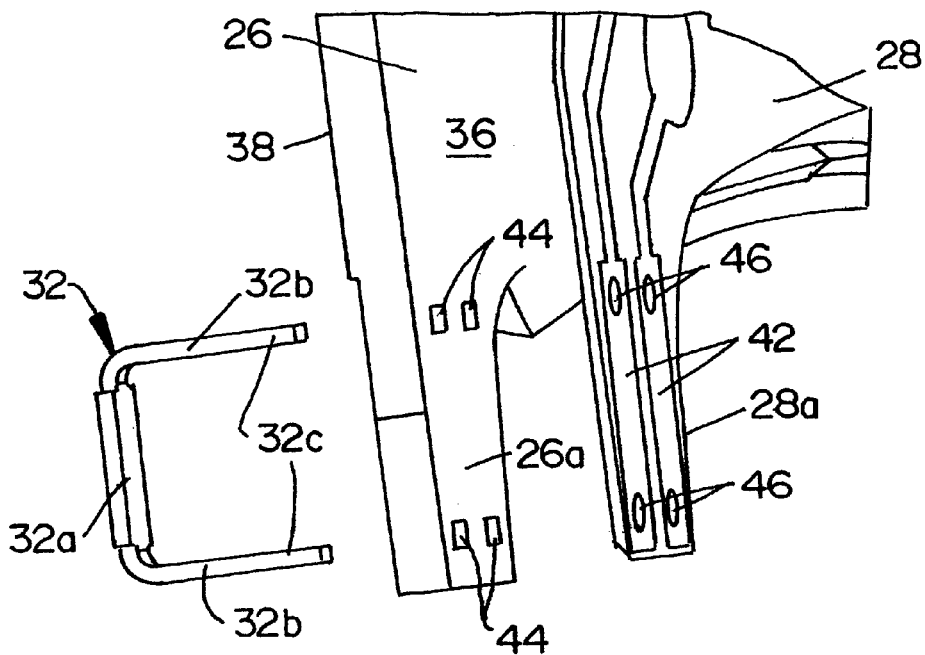
FIGS. 5A–5E are fragmented perspective views showing the steps in terminating the flat circuit.

More particularly, bottom support plate 26 includes a pair of laterally spaced leg portions 26a (FIGS. 3 and 4), one of which is shown in FIGS. 5A–5E. The bottom support plate and leg portions have a first or top side 36 (FIG. 5A) and a second or bottom side 38. Flat flexible circuit 28 is disposed on top side 36 of the support plate and includes leg portions 28a which are juxtaposed over leg portions 26a of the support plate. Flat flexible circuit 28 includes a pattern of conductors 40 (FIG. 4) with a pair of conductors 42 extending into each leg portion 28a as seen in FIG. 5A. If flat flexible circuit 28 is provided with a protective layer or film, the film is removed to expose conductors 42 at the top of the circuit. Each leg portion 26a of support plate 26 includes two pairs of apertures 44 which are aligned with two pairs of holes 46 in leg portions 28a of flat circuit 28. Holes 46 extend through conductors 42 as clearly seen in FIGS. 5A–5E.

Figure 5B:
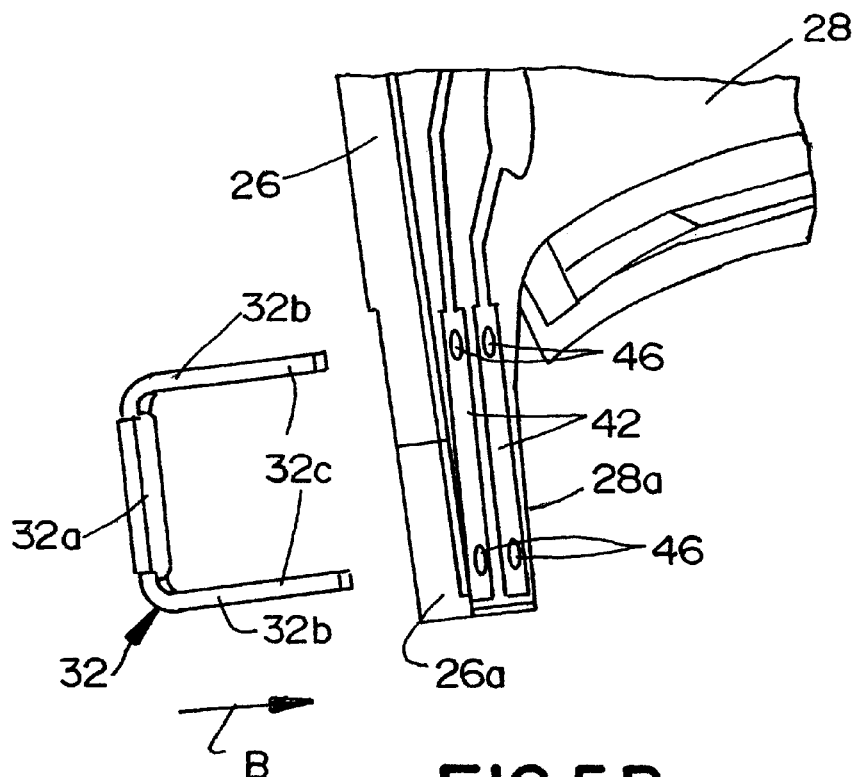
Figure 5C:
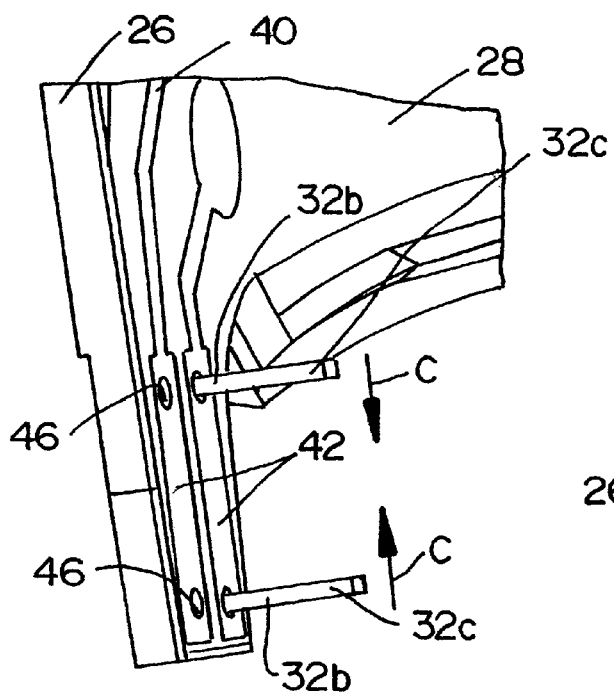

As best seen in FIGS. 5A and 5B, each terminal clip or terminal 32 is generally U-shaped and includes a contact portion or section 32a in the form of a flat contact plate. A pair of shank portions or connecting sections 32b project from opposite ends of contact portion 32a. The shank portions terminate in distal ends 32c which will form terminating portions of the terminal, as will be seen below. Although only one terminal 32 is shown in FIGS. 5A–5E, four terminals 32 are used with cover 14 as seen in FIGS. 1 and 4. One terminal is used for each of the two pairs of apertures 44 in support plate 26 and holes 46 in flat circuit 28 at each opposite side of the cover assembly.

Figure 5D:
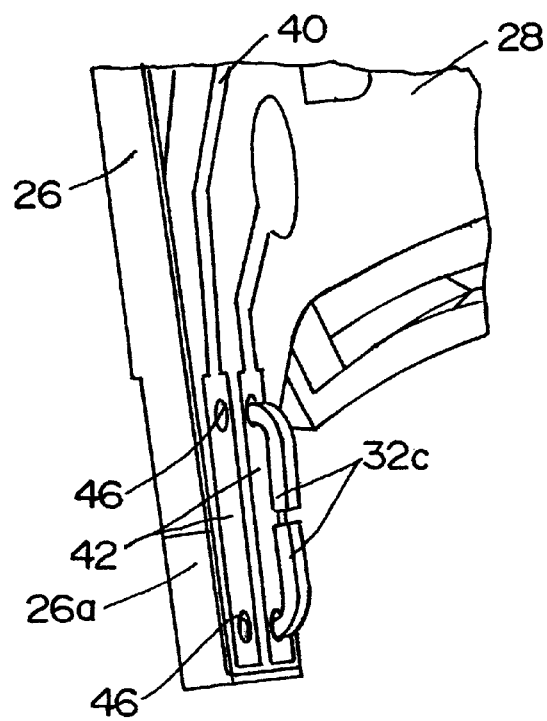
Figure 5E:
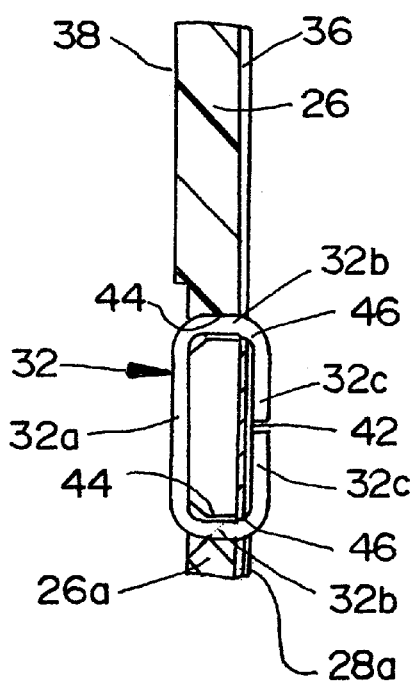

The system and method of the invention using terminals 32 now will be described in relation to FIGS. 5A–5E. Flat flexible circuit 28 first is mounted or positioned onto top side 36 (FIG. 5A) of support plate 26 as seen in FIG. 5B. The flat circuit may be appropriately adhered to the top side of the support plate, or the circuit may be press-fit within an array of ribs 50 (FIG. 4) projecting upwardly from the support plate. Terminals 32 then are assembled in the direction of arrow "B" (FIG. 5B) by inserting shank portions 32b first through apertures 44 in support plate 28 and then through holes 46 in flat circuit 28 until the shank portions extend completely through the assembly as shown by the one terminal in FIG. 5C. The distal ends of the shank portions then are bent inwardly in the direction of arrows "C" (FIG. 5C) until the distal ends form terminating portions 32c as shown in FIG. 5D. The terminating portions are bent inwardly until they tightly engage conductors 42 of flat flexible circuit 28.

From the foregoing, it can be seen that flat flexible circuit 28 is mounted to a first or top side 36 of support plate 26, while terminals 32 are mounted through a second or bottom side 38 of the support plate. When filly assembled, contact portions 32 of the terminals are located at the bottom of cover 14 as seen in FIG. 1, notwithstanding the fact that flat flexible circuit 28 is mounted on the top of support plate 26. By using this system, conductors 40 (FIG. 4) can be operatively associated with the keypad of the mobile telephone through apertures 24 (FIG. 2) at the top of the cover assembly, while conductors 42 (FIGS. 5A–5C) are operatively associated by terminals 32 through the cover assembly with switches 16 located at a completely opposite side of cover 14.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A cover assembly for a mobile telephone, comprising:
   a generally rigid dielectric cover having first and second sides with at least one aperture passing there through between the sides;
   a flat circuit on the first side of the cover and including at least one conductor; and a conductive terminal including
   a contact section at the second side of the cover for engaging a complementary connecting device and comprising a contact plate juxtaposed against the second side of the cover, and
   a connecting section extending from the contact section through the aperture in the cover and terminated to the conductor of the flat circuit.

2. The cover assembly of claim 1 wherein said connecting section of the terminal comprises a distal end of the connecting section bent into engagement with the conductor.

3. The cover assembly of claim 1 wherein said flat circuit comprises a flat flexible circuit.

4. The cover assembly of claim 1 wherein said cover includes a pair of said apertures, and the terminal is generally U-shaped with a pair of said connecting sections extending from opposite ends of the contact section through the apertures.

5. The cover assembly of claim 1 wherein said flat circuit includes a first side juxtaposed against the first side of the cover and a second side at which the at least one conductor is exposed, and the connecting section of the terminal extends through the flat circuit into engagement with the conductor on the second side of the circuit.

6. The cover assembly of claim 5 wherein said connecting section of the terminal comprises a distal end of the connecting section bent into engagement with the conductor.

7. A system for providing an electrical connection with a flat circuit, comprising:
   a generally rigid dielectric support structure;
   a flat circuit on one side of the support structure; and
   a terminal clip including
   a contact portion at an opposite side of the support structure for electrically engaging a complementary connecting device, said contact portion comprising a contact plate juxtaposed against the opposite side of the support structure a shank portion extending from the contact portion through the support structure, and a terminating portion at an end of the shank portion at said one side of the support structure, for termination to an appropriate conductor of the flat circuit.

8. The system of claim 7 wherein said terminating portion of the terminal clip comprises a distal end of the shank portion bent into engagement with the conductor.

9. The system of claim 7 wherein said flat circuit comprises a flat flexible circuit.

10. The system of claim 7 wherein said support structure includes a pair of apertures, and the terminal clip is generally U-shaped with a pair of said shank portions extending from opposite ends of the contact portion through the apertures.

11. The system of claim 7 wherein said flat circuit includes a first side juxtaposed against the one side of the support structure and a second side at which the conductor is exposed, and the shank portion of the terminal clip extends through the flat circuit into engagement with the conductor on the second side of the circuit.

12. The system of claim 11 wherein said terminating portion of the terminal clip comprises a distal end of the shank portion bent into engagement with the conductor.

13. A method of terminating a conductor of a flat circuit on a cover assembly for a mobile telephone, comprising the steps of:

providing a cover and forming at least one aperture in the cover;

mounting the flat circuit on a first side of the cover;

inserting a terminal through the aperture in the cover, with a contact portion of the terminal juxtaposed on a second side of the cover and a terminating portion engaging the conductor of the flat circuit on the first side of the cover.

14. The method of claim 1 including bending the terminating portion of the terminal into engagement with the conductor of the flat circuit.

* * * * *